United States Patent
Wang

(10) Patent No.: US 9,324,289 B2
(45) Date of Patent: Apr. 26, 2016

(54) ARRAY SUBSTRATE, DRIVING METHOD THEREOF AND DISPLAY DEVICE

(71) Applicants: BOE TECHNOLOGY GROUP CO., LTD., Beijing (CN); HEFEI BOE OPTOELECTRONICS TECHNOLOGY CO., LTD., Hefei (CN)

(72) Inventor: Sheng Wang, Beijing (CN)

(73) Assignees: BOE Technology Group Co., Ltd., Beijing (CN); HEFEI BOE Optoelectronics Technology Co., Ltd., Hefei (CN)

( * ) Notice: Subject to any disclaimer, the term of this patent is extended or adjusted under 35 U.S.C. 154(b) by 15 days.

(21) Appl. No.: 14/088,998

(22) Filed: Nov. 25, 2013

(65) Prior Publication Data

US 2014/0160102 A1    Jun. 12, 2014

(30) Foreign Application Priority Data

Dec. 6, 2012  (CN) .......................... 2012 1 0520223

(51) Int. Cl.
| | |
|---|---|
| G09G 3/36 | (2006.01) |
| G02F 1/1362 | (2006.01) |
| H01L 27/12 | (2006.01) |

(52) U.S. Cl.
CPC .......... *G09G 3/3659* (2013.01); *G02F 1/13624* (2013.01); *H01L 27/124* (2013.01); *G09G 2320/0214* (2013.01)

(58) Field of Classification Search
CPC ................... G09G 3/3659; G09G 2320/0214; G02F 1/13624; H01L 27/124

USPC ........................................................... 345/92
See application file for complete search history.

(56) References Cited

U.S. PATENT DOCUMENTS

| | | | | |
|---|---|---|---|---|
| 4,431,271 | A |   | 2/1984 | Okubo |
| 5,173,792 | A | * | 12/1992 | Matsueda ........................ 349/54 |
| 5,247,289 | A | * | 9/1993 | Matsueda ........................ 345/98 |
| 5,576,857 | A | * | 11/1996 | Takemura ........................ 349/42 |

(Continued)

FOREIGN PATENT DOCUMENTS

| | | |
|---|---|---|
| CN | 1624536 A | 6/2005 |
| JP | H01130133 A | 5/1989 |

(Continued)

OTHER PUBLICATIONS

English abstract of JP H0627489A, 2 pages.

(Continued)

*Primary Examiner* — Jonathan Boyd
(74) *Attorney, Agent, or Firm* — Banner & Witcoff, Ltd.

(57) ABSTRACT

Embodiments of the present invention disclose an array substrate and a driving method thereof, and a display device. The array substrate comprises: a pixel electrode; a data line; a first thin film transistor comprising a first gate electrode, a first source electrode and a first drain electrode, and a second thin film transistor comprising a second gate electrode, a second source electrode and a second drain electrode; a first gate line connected with the first gate electrode and a second gate line connected with the second gate electrode, wherein the first source electrode and the second source electrode are electrically connected with the data line, and the first drain electrode and the second drain electrode are electrically connected with the pixel electrode.

19 Claims, 3 Drawing Sheets

(56) References Cited

U.S. PATENT DOCUMENTS

| | | | |
|---|---|---|---|
| 6,753,839 B2* | 6/2004 | Fujita | 345/92 |
| 7,978,165 B2* | 7/2011 | Kamada | 345/92 |
| 2001/0046001 A1* | 11/2001 | Yamaguchi et al. | 349/43 |
| 2003/0184687 A1* | 10/2003 | Matsubara | 349/43 |
| 2005/0185108 A1* | 8/2005 | Chen | 349/43 |
| 2012/0062523 A1* | 3/2012 | Park et al. | 345/204 |

FOREIGN PATENT DOCUMENTS

| | | |
|---|---|---|
| JP | H0627489 A | 2/1994 |
| JP | H11-194365 A | 7/1999 |

OTHER PUBLICATIONS

English abstract of JP H01130133A, 2 pages.
Extended European search report issued by the European Patent Office on Apr. 3, 2014, 10 pages.
First Office Action in Chinese Patent Application No. 201210520223.1, dated Sep. 30, 2014, 6 pages.
English translation of text of First Office Action in Chinese Patent Application No. 201210520223.1, dated Sep. 30, 2014, 3 pages.
English abstract of CN 1624536 A.
English abstract of JP H11-194365 A.

* cited by examiner

ARRAY SUBSTRATE, DRIVING METHOD THEREOF AND DISPLAY DEVICE

CROSS REFERENCE TO RELATED APPLICATIONS

This application claims priority from Chinese National Application No. 201210520223.1 filed on Dec. 6, 2012, the contents of which are incorporated herein by reference.

TECHNICAL FIELD

Embodiments of the present invention relate to an array substrate, a driving method thereof and a display device.

BACKGROUND

Thin film field effect transistor liquid crystal display (TFT-LCD for short) is widely used in modern information devices such as television, computer, mobile phone and digital camera due to advantages of being light and thin and having low power consumption and etc. The TFT-LCD is mainly constituted by an array substrate and a color filter substrate. The array substrate comprises a gate electrode, a data line, a pixel electrode and a thin film transistor. When a high voltage is present at the gate electrode, the thin film transistor is turned on, and the pixel electrode is charged through the data line; when a low voltage is present at the gate electrode, the thin film transistor is turned off, and the stored voltage of the pixel electrode will last till the thin film transistor is turned on the next time.

The array substrate in the prior art is a single gate structure, as there is overlap between the gate electrode and the drain electrode in the thin film transistor, this structure renders a parasitic capacitance Cgd in the thin film transistor. As illustrated in FIG. 1, when the on/off voltage signal from the gate line controls and turns on the thin film transistor, the data voltage signal from the data line starts to charge the pixel electrode, and the pixel charge voltage at the pixel electrode gradually increases to a set value; when the thin film transistor is turned off, that is, the time when the on/off voltage signal is lowered to a low level, the charges stored at the parasitic capacitance Cgd change, then the voltage at the pixel electrode is changed and generates a leaping voltage $\Delta Vp$, and then picture flashing is incurred.

SUMMARY

An embodiment of the present invention provides an array substrate, comprising: a pixel electrode; a data line that provides a data voltage signal to the pixel electrode; a first thin film transistor comprising a first gate electrode, a first source electrode and a first drain electrode, and a second thin film transistor comprising a second gate electrode, a second source electrode and a second drain electrode; a first gate line connected with the first gate electrode and a second gate line connected with the second gate electrode, wherein the first source electrode and the second source electrode are electrically connected with the data line, and the first drain electrode and the second drain electrode are electrically connected with the pixel electrode.

Another embodiment of the present invention provides a display device comprising the array substrate according to any of the embodiments of the present invention.

Another embodiment of the present invention provides a driving method of the array substrate according to any of the embodiments of the present invention, and the method comprises: providing a turn-on signal to the first gate line and the second gate line so that the first thin film transistor and the second thin film transistor are turned on, and then the data line provides the data voltage signal to the pixel electrode; and providing a turn-off signal to the first gate line and the second gate line at different times, so that the first thin film transistor and the second thin film transistor are turned off.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

The embodiments of the present invention provide an array substrate and a liquid crystal display device, and can reduce the leaping voltage of the pixel electrode and then achieve a more stable picture display.

Figure 1:
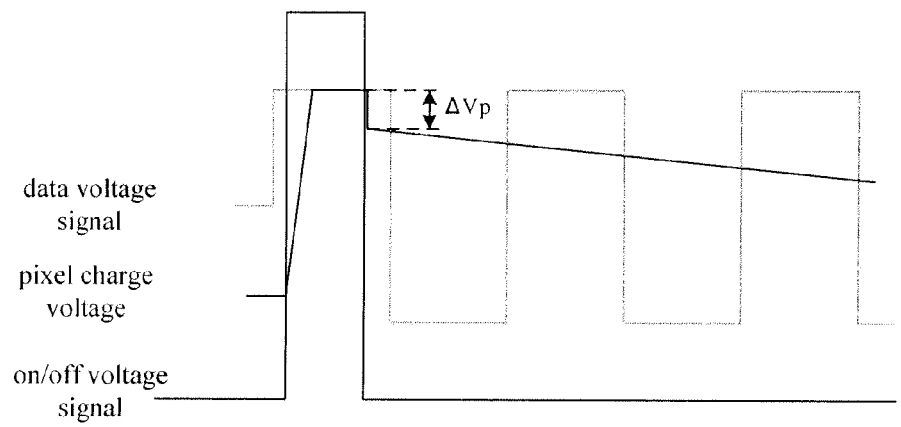
FIG. 1 is a schematic diagram of generating the leaping voltage in the prior art.
Figure 2:
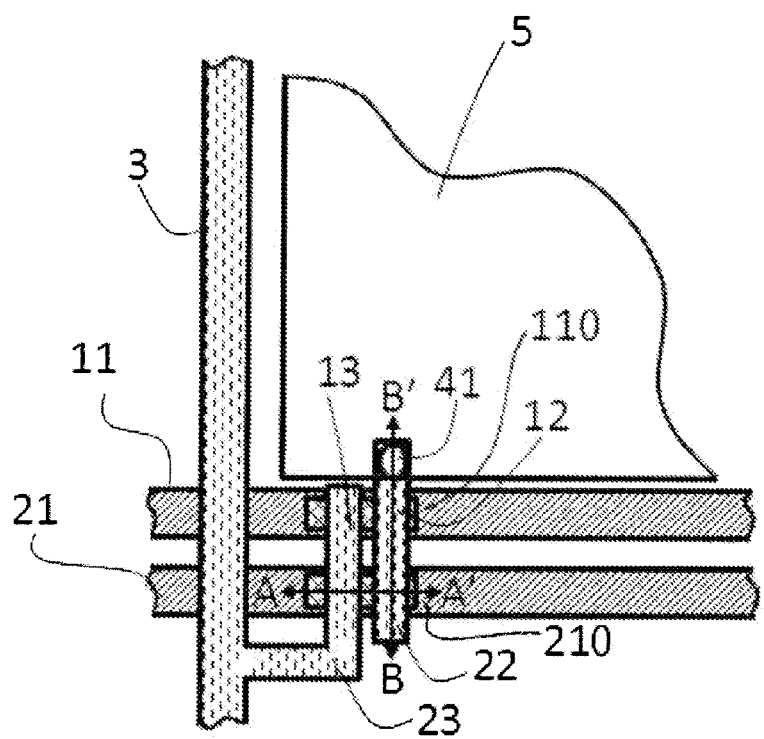
FIG. 2 is a first schematic diagram of the structure of the array substrate in the embodiments of the present invention.

The present embodiment provides an array substrate, as illustrated in FIG. 2, it comprises a pixel electrode 5 and a data line 3 providing a data voltage signal to the pixel electrode 5, and the array substrate of the present embodiment further comprises a first thin film transistor and a second thin film transistor, and each pixel electrode is connected with one said first thin film transistor and one said second thin film transistor. The first thin film transistor comprises a first gate electrode 110, the second thin film transistor comprises a second gate electrode 210, and two gate lines are provided between two adjacent rows of pixel electrodes: a first gate line 11 and a second gate line 21, and the first gate electrode is electrically connected with the first gate line 11, and the second gate electrode is electrically connected with the second gate line 21. In the present embodiment, the first gate line 11 and the first gate electrode are integrally formed, and the first gate electrode can be deemed as a part of the first gate line 11, and likewise, the second gate line 21 and the second gate electrode are integrally formed, and the second gate electrode can be deemed as a part of the second gate line 21. The first gate electrode 110 and the second gate electrode 210 provide the on/off voltage signal for the same pixel electrode 5, and are not turned off at the same time when providing the on/off voltage signal. The working principle of the present embodiment will be described hereinafter.

The present invention does not define the order of turning on the thin film transistors, and the first thin film transistor can be turned on earlier than the second thin film transistor, and can also be turned on later than the second thin film transistor, or the first thin film transistor and the second thin film transistor can be turned on at the same time. While, for the first thin film transistor and the second thin film transistor, one must be turned off earlier than the other. Description is made hereinafter taking it as an example that the first thin film transistor is turned on earlier and turned off earlier and the second thin film transistor is turned on later and turned off later.

Figure 3:
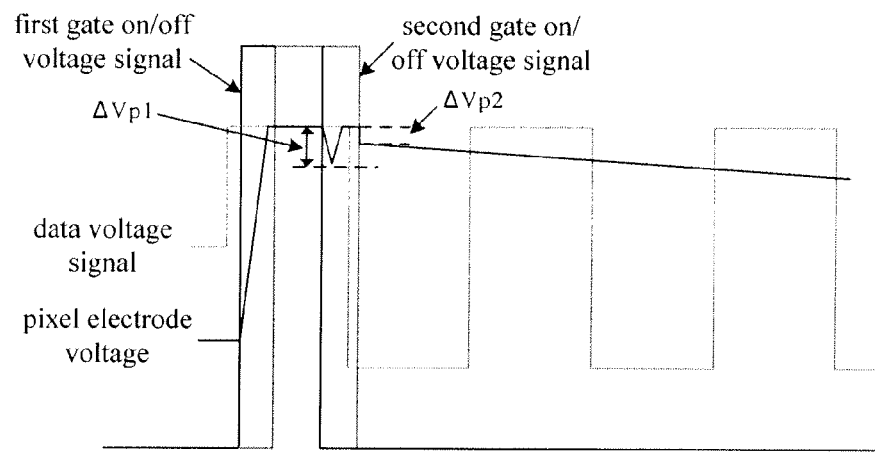
FIG. 3 is a schematic diagram of generating the leaping voltage in the embodiments of the present invention.

As illustrated in FIG. 3, when a high voltage is present at the first gate electrode 110, the first gate on/off voltage signal from the first gate line 11 controls and turns on the first thin film transistor, the data line 3 provides the data voltage signal to and charges the pixel electrode 5, and the pixel electrode voltage at the pixel electrode 5 gradually increases; then the second gate on/off voltage signal from the second gate line 21 controls and turns on the second thin film transistor, and the data line 3 charges the pixel electrode 5 through the first thin film transistor and the second thin film transistor, respectively. When the first gate electrode 110 restores low voltage, the first thin film transistor is turned off, at this moment, the pixel electrode voltage at the pixel electrode 5 decreases, and a leaping voltage $\Delta Vp1$ is generated at the pixel electrode 5.

As $\Delta Vp=[Cgd/(Cgd+Clc+Cst)]*(Vgh-Vgl)$, Cgd is the parasitic capacitance between the gate electrode and the drain electrode, Clc is a liquid crystal capacitance, Cst is a storage capacitance, and Vgh and Vgl are the turn-on voltage and the turn-off voltage of the gate electrode, respectively. When the thin film transistors work normally, Clc, Cst, Vgh and Vgl are usually constant, thus, $\Delta Vp$ is decided by Cgd, while $Cgd=\mu A/d$, wherein, $\mu$ is a constant, A is the area of the conductor forming the capacitance, and d is the distance between two conductors. In the array substrate, the distance between the drain electrode and the gate electrode is usually a constant value, thus, Cgd is decided by the overlapping area of the drain electrode and the gate electrode, which is an important factor affecting the charging efficiency of the pixel electrode 5, and to ensure fully charging the pixel electrode 5 in time, when producing the thin film transistors, the overlapping area between the drain electrode and the gate electrode is usually maintained within a certain value range. This renders it difficult to lower the value of the leaping voltage $\Delta Vp$ in the prior art.

The present invention uses a double-thin film transistor structure, and the first drain electrode 12 and the second drain electrode 22 generate an overlapping area with the first gate electrode 110 and the second gate electrode 210, respectively, and it is maintained that the total overlapping area does not have sharp changes with respect to the prior art. As an embodiment of the present invention, the overlapping area of the first drain electrode 12 and the first gate electrode 110 and the overlapping area of the second drain electrode 22 and the second gate electrode 210 can be a half of the overlapping area in the prior art, thus, the leaping voltage generated by each thin film transistor is a half of that in the prior art. For example, the overlapping area of the first gate electrode 110 and the first drain electrode 12 is larger than that of the second gate electrode 210 and the second drain electrode 22, thus, fast charging of the pixel electrode 5 is ensured, and the leaping voltage $\Delta Vp2$ generated by the second thin film transistor can be lowered to the lowest.

As illustrated in FIG. 3, the first thin film transistor is turned off, after a leaping voltage $\Delta Vp1$ is generated at the pixel electrode 5, as the second thin film transistor is still on, the second thin film transistor continuously makes the data voltage signal charge the pixel electrode 5 till it is fully charged, and when the second thin film transistor is turned off, the $\Delta Vp2$ is generated at the pixel electrode 5, that is, for the pixel electrode 5, the finally generated leaping voltage is $\Delta Vp2$ which, however, is obviously smaller compared with the leaping voltage generated in the prior art. The above method can reduce the leaping voltage of the overall pixel electrode 5 and improves the picture stability.

In an embodiment, as illustrated in FIG. 3, the times of providing the turn-on signal to the first gate electrode and the second gate electrode are different, that is, the first thin film transistor and the second thin film transistor are not turned on at the same time. However, the present invention is not limited to this. The first thin film transistor and the second thin film transistor can be turned on at the same time, that is, the first gate line and the second gate line can provide the turn-on signal at the same time, so that the data line can apply the data voltage signal to the pixel electrode through the first and the second thin film transistors.

As an embodiment of the present invention, as illustrated in FIG. 2, the first thin film transistor further comprises a first drain electrode 12, the second thin film transistor further comprises a second drain electrode 22 which is connected with the first drain electrode 12, and it can also be understood that the first thin film transistor and the second thin film transistor share one drain electrode. During the production, the shared drain electrode can be integrally formed. The first drain electrode 12 is connected with the pixel electrode 5 through the first through hole 41.

Figure 4:
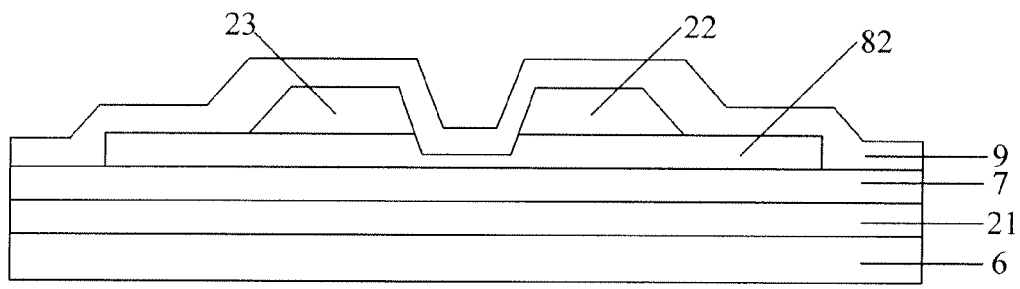
FIG. 4 is a section view of A-A' of FIG. 2.
Figure 5:
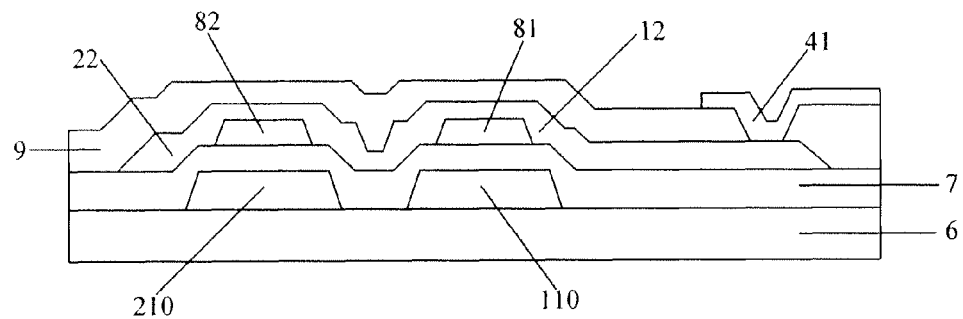
FIG. 5 is a section view of B-B' of FIG. 2.

In addition, as illustrated in FIGS. 4 and 5, as an embodiment of the present invention, the first gate electrode 110 and the second gate electrode 210 are both formed on the substrate 6, and are covered by the gate insulating layer 7; the first active layer 81 is provided between the gate insulating layer 7 and the first drain electrode 12, and the second active layer 82 is further provided between the gate insulating layer and the second drain electrode 22; and the passivation layer 9 covers the first drain electrode 12 and the second drain electrode 22. Besides the above structure, the array substrate of the present invention further comprises other necessary structures, and one skilled in the art can obtain the specific structures of the other parts, which are omitted herein.

Furthermore, as illustrated in FIG. 2, the first thin film transistor further comprises a first source electrode 13, the second thin film transistor further comprises a second source electrode 23 which is connected with the first source electrode 13, and it can also be understood that the first thin film transistor and the second thin film transistor share one source electrode. During the production, the shared source electrode can be integrally formed. The second source electrode 23 is connected with the data line 3.

In addition, the first thin film transistor and the second thin film transistor in the present embodiment may not share a source electrode, that is, the first source electrode 13 and the second source electrode 23 are connected with the data line 3, respectively, and are independent from each other.

Figure 6:
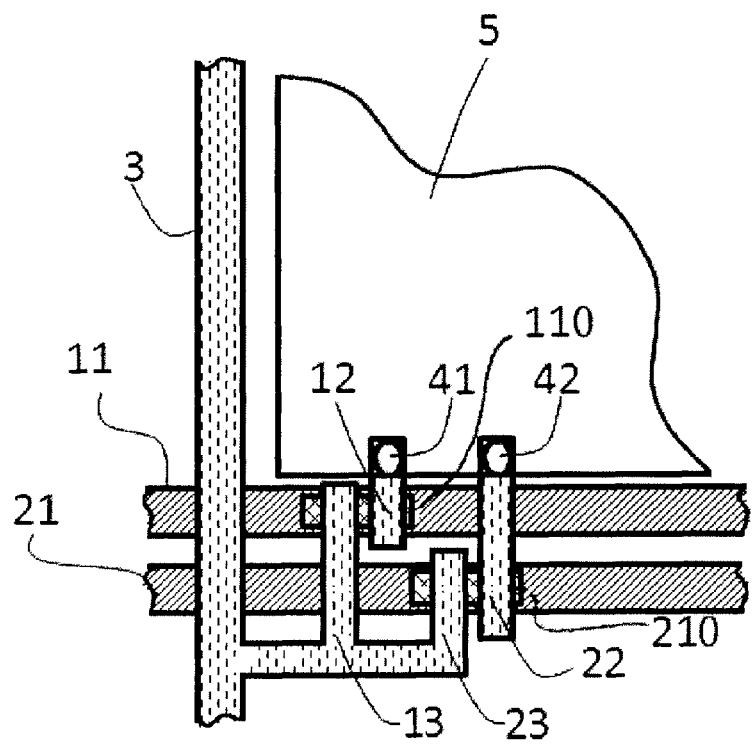
FIG. 6 is a second schematic diagram of the structure of the array substrate in the embodiments of the present invention.

As another embodiment of the present invention, as illustrated in FIG. 6, the first thin film transistor further comprises a first drain electrode 12, the second thin film transistor further comprises a second drain electrode 22, the first drain electrode 12 is connected with the pixel electrode 5 through the first through hole 41, and the second drain electrode 22 is connected with the pixel electrode 5 through the second through hole 42. Furthermore, the first thin film transistor further comprises a first source electrode 13, the second thin film transistor further comprises a second source electrode 23, and the first source electrode 13 and the second source electrode 23 are connected with the data line 3, respectively. It can be understood that the first thin film transistor and the second thin film transistor in the present embodiment are two separate thin film transistors and do not share any part.

In addition, the first thin film transistor and the second thin film transistor in the present embodiment can also share one source electrode, that is, the first source electrode 13 is connected with the second source electrode 23, and the second source electrode 23 are connected with the data line 3.

Furthermore, as illustrated in FIG. 2 or 6, the first drain electrode 12 and the second drain electrode 22 cross with the first gate electrode 110 and the second gate electrode 210, respectively, that is, the first drain electrode 12 completely covers the first gate electrode 110 in the direction perpendicular to the first gate electrode 110, and, the second drain electrode 22 completely covers the second gate electrode 210 in the direction perpendicular to the second gate electrode 210; or, the first drain electrode 12 and the second drain electrode 22 completely cover the first gate electrode 110 and the second gate electrode 210 in the direction which forms an angle with respect to the straight line along which the first gate electrode 110 extends. That is, in the extending directions of the first drain electrode 12 and the second drain electrode 22, the first drain electrode 12 extends to the outside of two sides of the first gate electrode 110, and the second drain electrode 22 extends to the outside of two sides of the second gate electrode 210. During the production of the array substrate, due to uncertain factors of the process and equipment, the overlapping areas of the gate electrode and the drain electrode in respective pixel units are different, for example, the drain electrode of some pixel unit only covers ½ of the width of the gate electrode, some is ⅔, while some is the whole width of the gate electrode, thus, the parasitic capacitances generated in respective pixel units are different, and then the leaping voltages $\Delta Vp$ at the pixel electrode 5 are also different, and such problems will also render non-uniform picture display. Therefore, all the drain electrodes and the gate electrodes in the present invention are arranged to cross with each other, preferably, the drain electrode extends to the outside of the gate electrode, that is, two ends of the drain electrode go beyond the gate electrode in the direction perpendicular to the gate electrode, and this method can compensate for the problem of non-uniform parasitic capacitances due to fluctuation of the process and equipment, and then improve quality of the picture display.

As discussed above, the embodiment according to the present invention can provide to each pixel electrode two gate lines (the first gate line and the second gate line), two thin film transistors (the first thin film transistor and the second thin film transistor) and one data line. The on/off states of the two thin film transistors are controlled through the two gate lines so as to achieve cutoff at different times.

The embodiments of the present invention also provide a display device comprising the array substrate described above. The display device can be a product or part having a display function, such as mobile phone, tablet computer, television, display, notebook computer, digital photo frame and navigator.

In addition, a driving method of the array substrate according to the embodiments of the present invention is provided. The method comprises: providing a turn-on signal to the first gate line and the second gate line so that the first thin film transistor and the second thin film transistor are turned on, and then the data line provides the data voltage signal to the pixel electrode; and providing a turn-off signal to the first gate line and the second gate line at different times, so that the first thin film transistor and the second thin film transistor are turned off.

In addition, in the situation that the overlapping area of the second drain electrode and the second gate electrode is smaller than the overlapping area of the first drain electrode and the first gate electrode, preferably, after the first gate line and the second gate line provide the turn-on signal to turn on the first and the second thin film transistors, the first gate line provides the turn-off signal earlier than the second gate line. Thus, the leaping voltage can be further reduced.

For the array substrate and the display device of the embodiments of the present invention, through arranging the first thin film transistor and the second thin film transistor, the first gate electrode of the first thin film transistor and the second gate electrode of the second thin film transistor provide the on/off voltage signal for the same pixel electrode, and the first gate electrode and the second gate electrode are not turned off at the same time when providing the on/off voltage signal, so that the thin film transistor turned off later reduces the leaping voltage generated at the pixel electrode by the thin film transistor turned off earlier, and thus the picture display is more stable.

The foregoing are merely exemplary embodiments of the invention, but are not used to limit the protection scope of the invention. The protection scope of the invention shall be defined by the attached claims.

The invention claimed is:

1. An array substrate, comprising:
   a pixel electrode;
   a data line that provides a data voltage signal to the pixel electrode;
   a first thin film transistor comprising a first gate electrode, a first source electrode and a first drain electrode, and a second thin film transistor comprising a second gate electrode, a second source electrode and a second drain electrode;
   a first gate line connected with the first gate electrode and a second gate line connected with the second gate electrode,
   wherein the first source electrode and the second source electrode are electrically connected with the data line, and the first drain electrode and the second drain electrode are electrically connected with the pixel electrode,
   wherein, the first gate line and the second gate line are configured to provide a turn-off signal at different times after they provide a turn-on signal, and provide the turn-on signal simultaneously for at least a period of time before providing the turn-off signal, and
   wherein the first gate line and the second gate line are connected respectively with the first and second gate electrodes of the first and second thin film transistors having the first and second drain electrodes that are electrically connected with the pixel electrode.

2. The array substrate according to claim 1, wherein, an overlapping area of the second drain electrode and the second gate electrode is smaller than an overlapping area of the first drain electrode and the first gate electrode.

3. The array substrate according to claim 1, wherein, the first drain electrode and the second drain electrode cross with the first gate electrode and the second gate electrode, respectively.

4. The array substrate according to claim 3, wherein, in extending directions of the first drain electrode and the second drain electrode, the first drain electrode extends to outside of two sides of the first gate electrode, and the second drain electrode extends to outside of two sides of the second gate electrode.

5. The array substrate according to claim 1, wherein, the second drain electrode is connected with the first drain electrode, and the first drain electrode is connected with the pixel electrode through a first through hole.

6. The array substrate according to claim 1, wherein, the first source electrode is connected with second source electrode, and the second source electrode is connected with the data line.

7. The array substrate according to claim 1, wherein, the first drain electrode is connected with the pixel electrode through a first through hole, and the second drain electrode is connected with the pixel electrode through a second through hole.

8. The array substrate according to claim 1, wherein, the first source electrode and the second source electrode are connected with the data line, respectively.

9. The array substrate according to claim 2, wherein, the first gate line and the second gate line are configured so that the first gate line provides a turn-off signal earlier than the second gate line after the first gate line and the second gate line provide a turn-on signal to turn on the first and the second thin film transistors.

10. The array substrate according to claim 2, wherein, the first drain electrode and the second drain electrode cross with the first gate electrode and the second gate electrode, respectively.

11. The array substrate according to claim 2, wherein, the second drain electrode is connected with the first drain electrode, and the first drain electrode is connected with the pixel electrode through a first through hole.

12. The array substrate according to claim 2, wherein, the first source electrode is connected with second source electrode, and the second source electrode is connected with the data line.

13. The array substrate according to claim 2, wherein, the first drain electrode is connected with the pixel electrode through a first through hole, and the second drain electrode is connected with the pixel electrode through a second through hole.

14. The array substrate according to claim 2, wherein, the first source electrode and the second source electrode are connected with the data line, respectively.

15. The array substrate according to claim 2, wherein, the first gate line and the second gate line are configured to provide a turn-off signal at different times after they provide a turn-on signal.

16. A display device, comprising the array substrate according to claim 1.

17. The display device according to claim 16, wherein, an overlapping area of the second drain electrode and the second gate electrode is smaller than an overlapping area of the first drain electrode and the first gate electrode.

18. A driving method of an array substrate, the array substrate comprising: a pixel electrode; a data line that provides a data voltage signal to the pixel electrode; a first thin film transistor comprising a first gate electrode, a first source electrode and a first drain electrode, and a second thin film transistor comprising a second gate electrode, a second source electrode and a second drain electrode; a first gate line connected with the first gate electrode and a second gate line connected with the second gate electrode, wherein the first source electrode and the second source electrode are electrically connected with the data line, and the first drain electrode and the second drain electrode are electrically connected with the pixel electrode, the method comprises:
providing a turn-on signal to the first gate line and the second gate line so that the first thin film transistor and the second thin film transistor are turned on, and then the data line provides the data voltage signal to the pixel electrode; and
providing a turn-off signal to the first gate line and the second gate line at different times, so that the first thin film transistor and the second thin film transistor are turned off,
wherein the first gate line and the second gate line provide the turn-on signal simultaneously for at least a period of time before providing the turn-off signal,
wherein the first gate line and the second gate line are connected respectively with the first and second gate electrodes of the first and second thin film transistors having the first and second drain electrodes that are electrically connected with the pixel electrode.

19. The driving method according to claim 18,
wherein an overlapping area of the second drain electrode and the second gate electrode is smaller than an overlapping area of the first drain electrode and the first gate electrode, and
wherein, after the first gate line and the second gate line provide a turn-on signal to turn on the first and the second thin film transistors, the first gate line provides a turn-off signal earlier than the second gate line.

* * * * *